United States Patent
Hubara

(12) 
(10) Patent No.: US 10,491,239 B1
(45) Date of Patent: Nov. 26, 2019

(54) LARGE-SCALE COMPUTATIONS USING AN ADAPTIVE NUMERICAL FORMAT

(71) Applicant: Habana Labs Ltd., Tel Aviv (IL)

(72) Inventor: Itay Hubara, Palo Alto, CA (US)

(73) Assignee: Habana Labs Ltd., Caesarea (IL)

( * ) Notice: Subject to any disclaimer, the term of this patent is extended or adjusted under 35 U.S.C. 154(b) by 3 days.

(21) Appl. No.: 15/883,119

(22) Filed: Jan. 30, 2018

Related U.S. Application Data

(60) Provisional application No. 62/453,546, filed on Feb. 2, 2017.

(51) Int. Cl.
| | | |
|---|---|---|
| *H03M 7/24* | (2006.01) | |
| *G06F 7/499* | (2006.01) | |
| *G06F 5/01* | (2006.01) | |

(52) U.S. Cl.
CPC .............. *H03M 7/24* (2013.01); *G06F 5/012* (2013.01); *G06F 7/49947* (2013.01)

(58) Field of Classification Search
CPC ........ G06F 17/11; G06F 17/16; G06F 17/153; G06F 7/523; G06F 7/4991; G06F 7/49921; G06F 7/49942; G06F 5/01; G06F 5/012; G06N 3/04; G06N 3/063; G06N 3/0418; G06N 3/08
USPC .................................. 708/204, 207, 208, 209
See application file for complete search history.

(56) References Cited

U.S. PATENT DOCUMENTS

| 2017/0061279 A1* | 3/2017 | Yang ...................... G06N 3/084 |
| 2018/0018560 A1* | 1/2018 | Saldana ................ G06N 3/063 |
| 2018/0046894 A1* | 2/2018 | Yao ......................... G06F 7/483 |
| 2019/0073582 A1* | 3/2019 | Yang ................... G06K 9/00986 |

OTHER PUBLICATIONS

T. Na et al., Speeding up Convolutional Neural Network Training with Dynamic Precision Scaling and Flexible Multiplier-Accumulator, ACM, ISPLED '16, 2016, (Year: 2016).*
M. Courbariaux et al., Training Deep Neural Networks with Low Precision Multiplications, arXiv:1412.7024v5 [cs.LG], 2015 (Year: 2015).*
F. Sun et al., Intra-Layer Nonuniform Quantization of Convolutional Neural Network, arXiv:1607.02720v2 [cs.CV], 2016 (Year: 2016).*

(Continued)

*Primary Examiner* — Andrew Caldwell
*Assistant Examiner* — Emily E Larocque
(74) *Attorney, Agent, or Firm* — Kligler & Associates

(57) ABSTRACT

A computational device includes an input memory, which receives a first array of input numbers having a first precision represented by N bits. An output memory stores a second array of output numbers having a second precision represented by M bits, M<N. Quantization logic reads the input numbers from the input memory, extracts from each input number a set of M bits, at a bit offset within the input number that is indicated by a quantization factor, and writes a corresponding output number based on the extracted set of bits to the second array in the output memory. A quantization controller sets the quantization factor so as to optimally fit an available range of the output numbers in the second array to an actual range of the input numbers in the first array in extraction of the M bits from the input numbers.

12 Claims, 4 Drawing Sheets

(56) References Cited

OTHER PUBLICATIONS

Gupta et al., "Deep Learning with Limited Numerical Precision", Proceedings of the 32nd International Conference on International Conference on Machine Learning, vol. 37, pp. 1737-1746, Lille, France, Jul. 6-11, 2015.

Koster et al., "Flexpoint: An Adaptive Numerical Format for Efficient Training of Deep Neural Networks", The 31st Annual Conference on Neural Information Processing Systems (NIPS), 14 pages, Long Beach, USA, Dec. 4-9, 2017.

* cited by examiner

LARGE-SCALE COMPUTATIONS USING AN ADAPTIVE NUMERICAL FORMAT

CROSS-REFERENCE TO RELATED APPLICATION

This application claims the benefit of U.S. Provisional Patent Application 62/453,546, filed Feb. 2, 2017, which is incorporated herein by reference.

FIELD OF THE INVENTION

The present invention relates generally to computational devices and methods, and particularly to enhancing efficiency of computational hardware.

BACKGROUND

To maintain high computational precision, computers generally perform mathematical computations on numbers in either a floating-point format or in a fixed-point format with a large number of digits (for example, 32 or 64 bits). To avoid loss of precision in matrix computations, for example, computing devices commonly accumulate multiplication results in a 32-bit floating-point format, in which each number is represented by a 24-bit mantissa (including a sign bit) and an eight-bit exponent. This format creates a strain on memory resources and computational logic, particularly in large-scale, repeated computations, such as tensor computations that are used in training deep neural networks.

Some authors have suggested that numerical precision can be reduced in deep learning applications without causing a severe degradation of performance. (The term "numerical precision" is used in the present description and in the claims in its conventional sense, to refer to the number of bits that are used in representing a number.) For example, Gupta et al. describe a scheme for training deep networks using only 16-bit wide fixed-point numbers in "Deep Learning with Limited Numerical Precision," published as arXiv preprint arXiv:1502.02551v1 (2015). The authors use a stochastic rounding technique in converting numbers to the lower-precision format and demonstrate that little or no degradation of classification accuracy is incurred when this technique is used in training computations.

SUMMARY

Embodiments of the present invention that are described hereinbelow provide improved computational methods and devices using a numerical format with reduced precision.

There is therefore provided, in accordance with an embodiment of the invention, a computational device, including an input memory, configured to receive a first array of input numbers having a first precision, such that each input number is represented by N bits, and an output memory, configured to store a second array of output numbers having a second precision, less than the first precision, such that each output number is represented by M bits, M<N. Quantization logic is configured to read the input numbers from the input memory, to extract from each input number a set of M bits, at a bit offset within the input number that is indicated by a quantization factor, and to write a corresponding output number based on the extracted set of bits to the second array in the output memory. A quantization controller is configured to set the quantization factor so as to optimally fit an available range of the output numbers in the second array to an actual range of the input numbers in the first array in extraction of the M bits from the input numbers.

In some embodiments, the input numbers include fixed-point numbers having a predefined radix point, and the quantization factor indicates a shift of the radix point in the output numbers relative to the input numbers. Alternatively, the input numbers include floating-point numbers, while the output number include fixed-point numbers, and the quantization logic is configured to convert the floating-point numbers to the fixed-point numbers, while setting a radix point of the fixed-point numbers responsively to the quantization factor. In some embodiments, the quantization logic is further configured to extract a sign bit from the input number and to apply the sign bit to the corresponding output number.

In a disclosed embodiment, the bits of the input number that are less significant than the extracted set of bits define a quantization remainder, and the quantization logic is configured to make a comparison between the quantization remainder and a random number, and to derive the corresponding output number by rounding the extracted set of bits responsively to the comparison.

In the disclosed embodiments, the quantization controller is configured to adjust the quantization factor responsively to a predefined limitation on overflow in the extraction of the M bits from the input numbers. Typically, the bits of the input number that are more significant than the extracted set of bits define an overflow, and the quantization controller is configured to increment the quantization factor when the overflow exceeds a predefined limit.

Additionally or alternatively, the quantization controller is configured to fit the available range of the output numbers in the second array to the actual range of the input numbers in the first array by estimating a largest value among the input numbers, and setting the quantization factor so that the largest value fills but does not overflow the set of bits extracted by the quantization logic. In one embodiment, the input numbers are elements of a product matrix derived by multiplying a pair of operand matrices, and the quantization controller is configured to estimate the largest value based on the operand matrices. In a disclosed embodiment, the limitation on the overflow is defined by a saturation margin SM, and the quantization controller is configured to set the quantization factor to a value QF such that $2^{(M+QF)}$ is no less than the estimated largest value among the input numbers, and $2^{(M+QF-SM)}$ is less than the estimated largest value among the input numbers.

There is also provided, in accordance with an embodiment of the invention, a method for computation, which includes receiving a first array of input numbers having a first precision, such that each input number is represented by N bits. A set of M bits, M<N, is extracted from each input number at a bit offset within the input number that is indicated by a quantization factor. A corresponding output number is written, based on the extracted set of bits, to a second array of output numbers having a second precision, less than the first precision, such that each output number is represented by M bits. The quantization factor is set so as to optimally fit an available range of the output numbers in the second array to an actual range of the input numbers in the first array in extraction of the M bits from the input numbers.

The present invention will be more fully understood from the following detailed description of the embodiments thereof, taken together with the drawings in which:

DETAILED DESCRIPTION OF EMBODIMENTS

Overview

Figure 1:
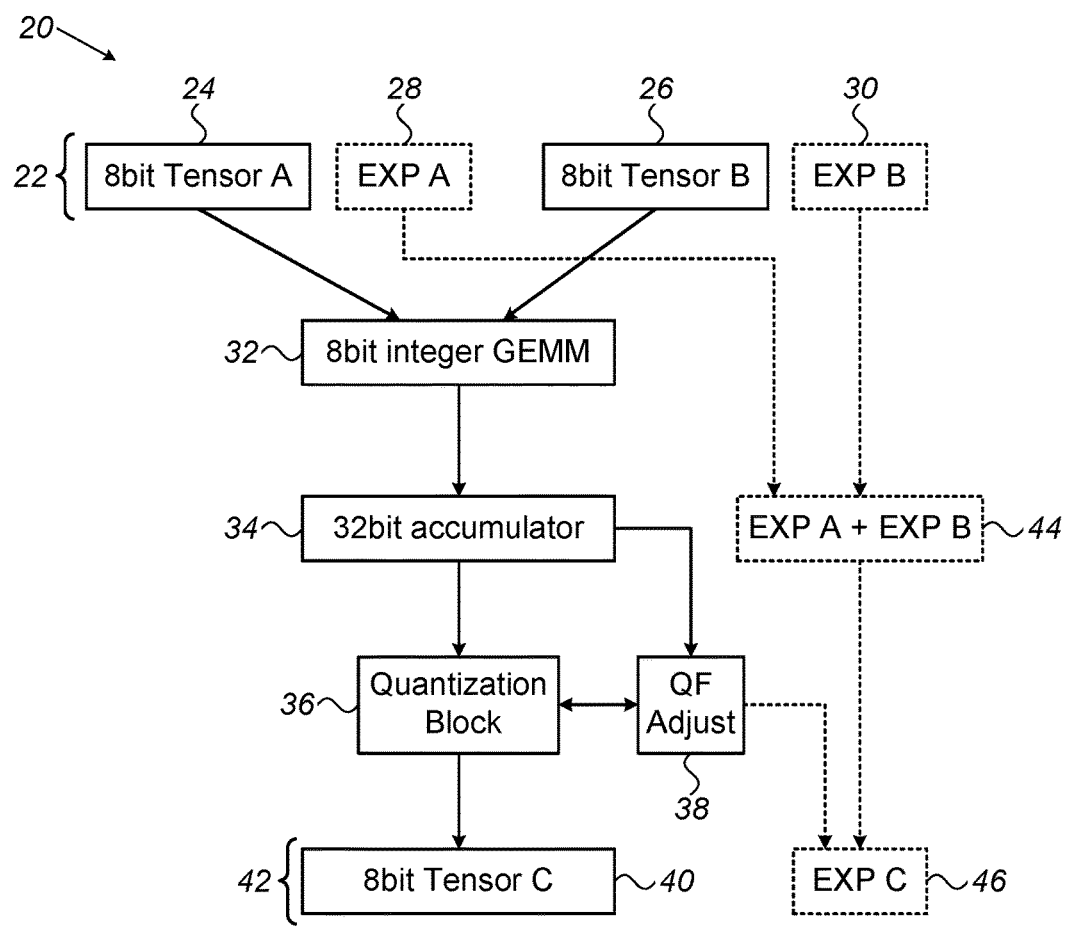
FIG. 1 is a block diagram that schematically illustrates a computational device, in accordance with an embodiment of the invention.

Embodiments of the present invention that are described herein provide a novel, adaptive numerical format and associated techniques that make it possible to reduce the numerical precision of mathematical operations and stored data, while optimally fitting the available numerical range to the actual range of the input numbers. Fitting the available range to the actual range is "optimal" in the sense that when a given array of input numbers is converted to the present numerical format at a given precision, the most significant bit of the largest input number occupies the most significant bit in the range of output numbers, thus taking full advantage of the available bits. The input numbers are converted using a quantization factor, which is chosen to give an optimal fit for the given array of input numbers, and which may be adjusted if the range of input numbers changes.

In this manner, overflow is kept within predefined limits, meaning that no more than a small fraction of the input numbers will saturate the available numerical range. When the input numbers are signed, this sort of saturation can result from either a positive or a negative number whose absolute value is outside the numerical range of the output numbers that is defined by the quantization factor. The latter case (a negative number with excessive absolute value) is referred to as an "underflow." For simplicity in the description that follows and in the claims, however, the term "overflow" will be used collectively to refer to both overflows and underflows of signed numbers, unless the context indicates otherwise.

The adaptive numerical format provided by the present embodiments combines features of floating-point and fixed-point numerical representations. In the present embodiments, each number in an array is represented by an integer-type value, without its own explicit exponent or radix point. The radix point (or equivalently, the exponent value) is stored in the form of a quantization factor (QF) for the entire array, which is set on the basis of the statistical distribution of the actual values of the numbers in the array. This format and adaptive approach are particularly useful in reducing the computational complexity, memory requirements and power consumption of tensor operations, such as those used in training neural networks. The principles of the present invention, however, are by no means limited to this sort of environment and may alternatively be used in other large-scale computation and data storage applications.

The quantization factor that is used in embodiments of the present invention can be computed and updated dynamically, for example by sampling the statistics of the high-precision input numbers that are to be converted to lower-precision output numbers in the present adaptive format. This sampling can be carried out while or even before the high-precision numbers are computed. In computational frameworks such as neural nets, in which computations are repeated over successive arrays of input numbers, the statics from a computation over a given array of input numbers can be used in updating the quantization factor that will be applied in the next iteration, over the next array of input numbers. Thus, if too many overflows are then found to occur in actual conversion of the input numbers to the adaptive format in a given iteration, the quantization factor can be updated in the next iteration.

In the disclosed embodiments, a computational device comprises an input memory, which receives an array of input numbers having a precision of N bits, and an output memory, which is configured to store an array of output numbers having a lower precision of M bits, i.e., M<N. The input memory may comprise, for example, an accumulator that receives the results of a matrix multiplication. The input numbers may comprise fixed-point or floating-point values, whereas the output numbers are stored as fixed-point values, with a quantization factor that defines the radix point of the output numbers for future operations (such as further multiplication and addition or conversion to floating point numbers).

To generate the output numbers, quantization logic reads the input numbers from the input memory, and extracts from each input number a set of M bits, at a bit offset within the input number that is indicated by the quantization factor. The quantization logic then writes the corresponding output number, based on the extracted set of bits, to the output memory. A quantization controller sets the quantization factor based on the input numbers, as explained above, so as to optimally fit the available range of the output numbers to the actual range of the input numbers, subject to whatever overflow limitation has been defined. In some embodiments, the quantization logic applies a stochastic rounding scheme in deriving the output numbers from the extracted sets of bits. These processes are described in detail hereinbelow.

Operating Environment

FIG. 1 is a block diagram that schematically illustrates a computational device 20, in accordance with an embodiment of the invention. Device 20 represents, for example, a layer in a deep neural network, which multiplies a first operand tensor 24 by a second operand tensor 26 (labeled tensors A and B) to give an output tensor 40 (labeled tensor C). Tensors A, B and C are assumed in this examples to contain 8-bit values, which are stored in an operand memory 22 and an output memory 42, respectively. Memories 22 and 42 typically comprise random-access memory (RAM) arrays.

One or both of tensors A and B may actually have originated as floating-point values. FIG. 1 assumes, however, that if so, the floating-point numbers have been quantized and stored in the adaptive, fixed-point representation defined herein. In this case, the values in memory 22 represent the mantissas of the floating-point numbers, with a common fixed radix point. Each tensor has a respective exponent value 28, 30 (labeled EXP A and EXP B), indicating the common radix point and exponent for the entire tensor. A method for conversion of floating-point numbers to the present format is described hereinbelow with reference to FIG. 4.

In the pictured example, the eight-bit tensor values in memories 24 and 26 are multiplied together by a general matrix to matrix multiplier (GEMM) 32, as is known in the art. The product matrix is stored in the form of 32-bit fixed-pointed numbers in an accumulator 34. The product matrix may also have a shared input exponent value 44, corresponding to the sum of EXP A and EXP B, with an additional indication of the radix point location.

Accumulator 34 serves as the input memory for quantization logic 36, which reads the array of input numbers from the accumulator and extracts from each input number a set of M bits (with M=8 in the present example), at a bit offset within the input number that is indicated by an adaptive quantization factor. Quantization logic 36 then writes a corresponding output number, based on the extracted set of M bits, to an array of output numbers in an output memory 42. The quantization factor indicates a corresponding shift of the radix point in the output numbers in memory 42 relative to the input numbers in accumulator 34. The output numbers in the present example are the elements of an eight-bit tensor C, and may be equal to the extracted bits or may be rounded, using any suitable rounding scheme. Memory 42 may serve, for example, as an operand memory in the next layer of computation.

Figure 2:
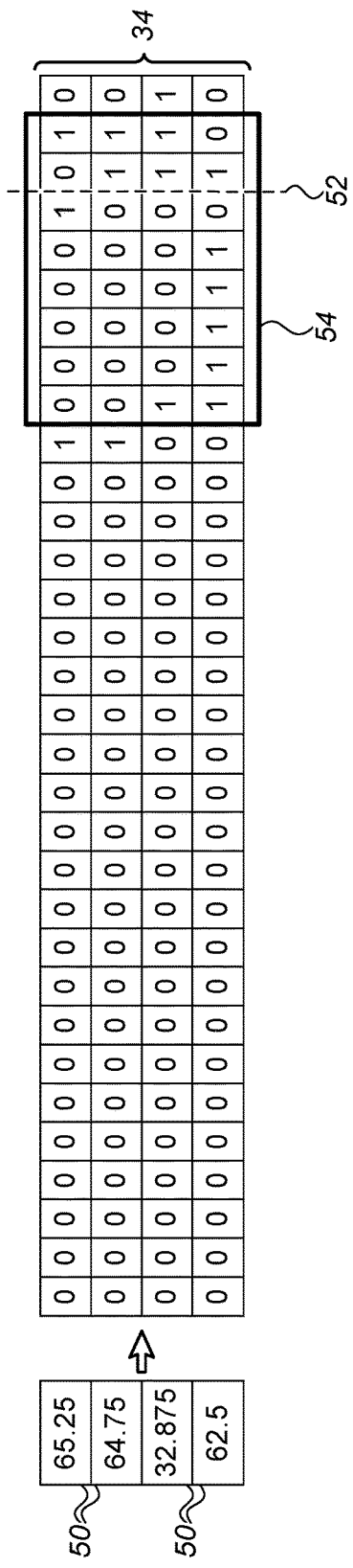
FIG. 2 is a block diagram that schematically illustrates a process of quantization of an array of numbers, in accordance with an embodiment of the invention.

A quantization controller 38 adjusts the quantization factor so as to optimally fit the available range of the output numbers in tensor C, based on the statistics of the input numbers in accumulator 34. For this purpose, quantization controller 38 chooses and adjusts the quantization factor so that overflow in extraction of the eight bits from the input numbers is avoided, or at least kept within predefined limits. An overflow occurs when an input number has a most-significant bit that falls outside the set of M bits extracted at the offset indicated by the quantization factor (as illustrated in FIG. 2). The quantization controller 38 typically selects and adjusts the quantization factor so that overflows occur in no more than a certain (small) fraction of the eight-bit values extracted from the input numbers. Quantization controller 38 can also update a shared output exponent value 46 for the output numbers in memory 42, reflecting the shift in the radix point, relative to input exponent value 44, due to the selected quantization factor.

In some embodiments, quantization controller 38 maximizes the dynamic range by estimating the largest value among the input numbers, and setting the quantization factor so that the largest value fills but does not overflow the set of bits extracted by quantization logic 36. For this purpose, quantization controller 38 can read and use the actual values in the input memory (accumulator 34 in the present example). Alternatively or additionally, when quantization logic 36 is to operate on the product of a matrix multiplication as in device 20, quantization controller 38 can set the radix point of the input numbers based on the elements of the operand matrices (i.e., the elements of tensors A and B) in operand memory 22.

Quantization logic 36 and quantization controller 38 are typically implemented in hard-wired digital logic circuits within an integrated circuit chip, possibly together with the other components of device 20. Additionally or alternatively, at least some of the functions of quantization controller 38 may be carried out by a programmable processor, such as an embedded processing core, under the control of suitable firmware or software. Alternatively, multi-chip implementations are also possible and are within the scope of the present invention.

In device 20 and in the detailed explanation that is presented below, quantization logic 36 is assumed, for the sake of concreteness and clarity, to transform 32-bit values (N=32) in accumulator 34 to eight-bit values (M=8) in output memory 42. Alternatively, however, the principles of the present invention may be applied in transforming substantially any array of N-bit input numbers to a corresponding array of M-bit output numbers, with M<N. This functionality may be implemented in the context of matrix or tensor multiplication, as in the present example, or in any other context in which this sort of adaptive reduction of precision is advantageous. All such alternative embodiments are considered to be within the scope of the present invention.

Setting the Quantization Factor

FIG. 2 is a block diagram that schematically illustrates a process of quantization of an array of numbers 50, in accordance with an embodiment of the invention. In the present example, numbers 50 are elements of a 32-bit fixed-point tensor in accumulator 34, with the values 65.25, 64.75, 32.875, and 62.5 and a radix point indicated by a dashed line 52. Quantization controller 38 sets the quantization factor QF=−2, meaning that the least significant bit in the set of bits extracted by quantization logic 36 will be two places to the right of the radix point. The anticipated dynamic range of the output numbers is thus $[2^{(8-2)}-1, -2^{(8-2)}]$, and the precision is 0.25. The set of bits to be extracted is marked in FIG. 2 as falling within a window 54. (In this simplified example, all of numbers 50 are assumed to be positive; but in general, quantization logic 36 will also extract a sign bit from numbers 50, so that the M bits may represent either a positive or a negative value.)

The bits of the input numbers that are more significant than the extracted set of bits within window define an overflow, which will cause quantization controller 38 to increment QF when the overflow exceeds a predefined limit. In the pictured example, an overflow has occurred in each of the first two rows in FIG. 2, as a '1' appears to the left of window 54—indicating that the most significant bit of these numbers has not been extracted. An overflow counter maintained by quantization controller 38 will now have the value two. Depending on the applicable overflow limitation (which may be fixed or programmable) of the quantization controller, this overflow count may trigger a QF update, resulting in incrementing the value to QF=−1, thus shifting window 54 one slot to the left and avoiding future overflows.

The third row in FIG. 2 (representing 32.875) is truncated by window 54 to the closest eight-bit representation (32.75), thus reducing its precision. (The least significant '1', appearing to the right of window 54, is left out.) Alternatively, this value may be rounded, as explained further hereinbelow. The precision of the fourth row is unaffected.

Figure 3:
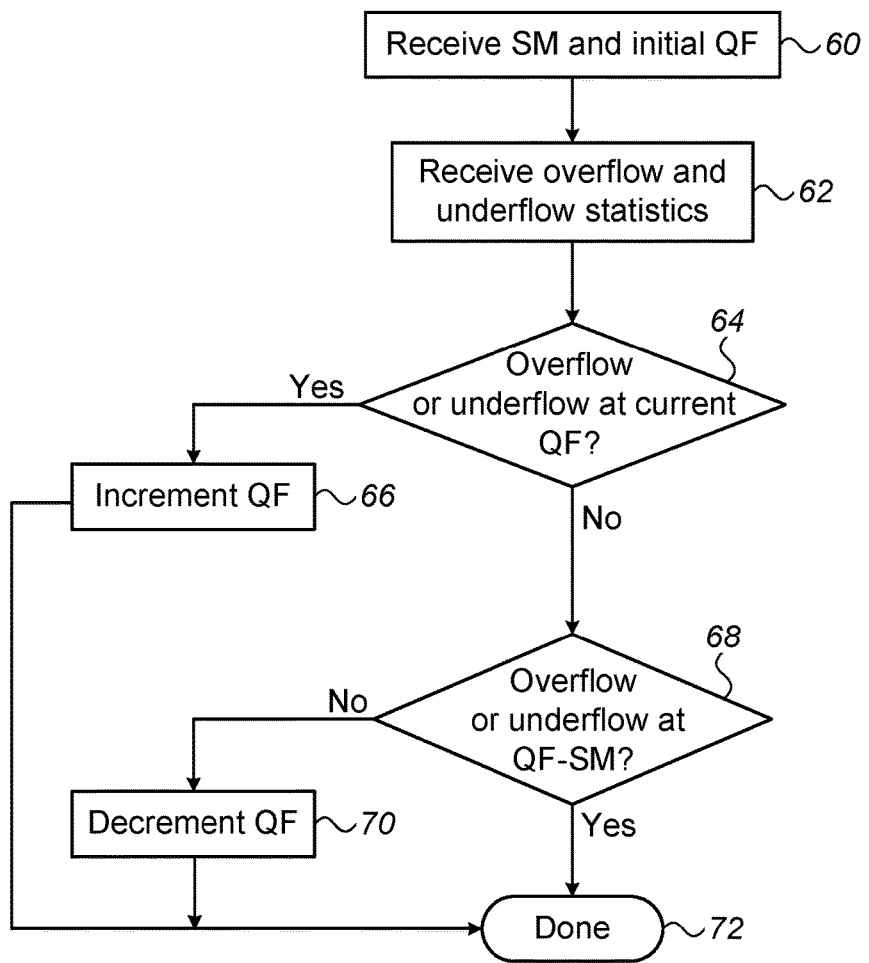
FIG. 3 is a flow chart that schematically illustrates a method for setting a quantization factor, in accordance with an embodiment of the invention.

FIG. 3 is a flow chart that schematically illustrates a method applied by quantization controller 38 in setting QF, in accordance with an embodiment of the invention. In this example, quantization controller 38 operates under an overflow limitation that is defined by a saturation margin SM. The quantization controller will set QF adaptively so that no overflows occur, and will increase QF if necessary so that $2^{(N+QF)}$ is no less than the largest absolute value encountered among the input numbers. On the other hand, the quantization controller may attempt to decrease QF in order to better fit the input numbers, but in this case will first make sure that $2^{(M+QF-SM)}$ is still no less than the largest absolute value, so that the fit is optimized subject to the overflow limitation. When the numbers to be quantized are signed numbers, these criteria are applied to the largest positive values and smallest (most highly negative) values among the input numbers. In the description that follows, the numbers are assumed to be signed, meaning that quantization controller 38 ensures that the maximum value (Max) among the input numbers is no greater than $2^{(M+QF-1)}$, and the minimum value (Min) is no less than $-2^{(M+QF-1)}$.

To begin the process, quantization controller 38 selects or otherwise receives the value of SM and an initial value of QF, at an initialization step 60. The quantization controller also receives overflow and underflow statistics, for example the numbers of overflows and underflows encountered in processing a previous array of input numbers, at statistics input step 62. Quantization controller 38 checks whether any overflows or underflows were actually encountered, at an overflow checking step 64. If such an overflow condition is detected, quantization controller 38 increments the value of QF to QF+1, at an incrementing step 66. When the predefined overflow limitations permit a certain (small) number of overflows, controller 38 will increment the value of QF at step 66 only when the number of overflows encountered exceeds the permitted number.

Otherwise, if no overflow is detected at step 64, quantization controller 38 checks whether an overflow or underflow would have occurred if QF were decremented, at a range checking step 68. For this purpose, as explained above, the quantization controller checks whether Max is less than or equal to $2^{(M+QF-SM-1)}$, and whether Min is less than or equal to $-2^{(M+QF-SM-1)}$ (assuming the numbers to be signed, as explained above). If decrementing QF would not have caused an overflow or underflow, the quantization controller concludes that the current value of QF is too high, and decrements the value of QF to QF−1 in order to optimize the fit of window 54 to the input numbers, at a decrementing step 70. This process concludes when the optimal value of QF has been found, at a completion step 72.

Although the above description assumes that accumulator 34 holds fixed-point values, in some cases, the input numbers that are to be quantized are floating-point numbers. In such cases, quantization logic 36 converts these floating-point input numbers to intermediate fixed-point values, which are then quantized to give the fixed-point numbers in output memory 42. Quantization controller sets the radix point of the fixed-point numbers according to the quantization factor QF, subject to an overflow limitation that is expressed by an overflow margin (OM), indicating the maximum permitted number of overflow bits. In other words, the value of OM implies an assumption that the largest input absolute value will be no greater than $2^{(M+QF+OM)}$.

Figure 4:
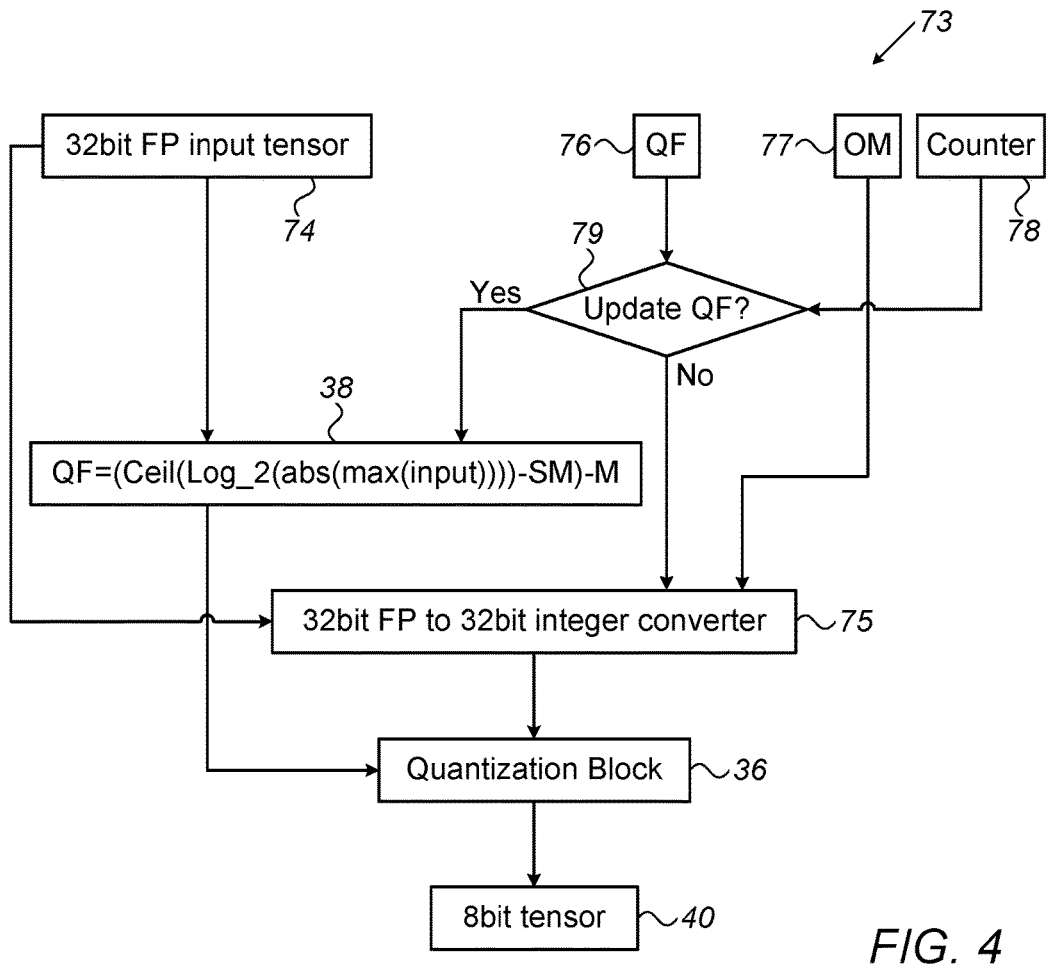
FIG. 4 is a flow chart that schematically illustrates a method for quantization of floating-point numbers, in accordance with an embodiment of the invention.

FIG. 4 is a flow chart that schematically illustrates a method for quantization of floating-point numbers based on this model, in accordance with an embodiment of the invention. Floating-point conversion logic 73 takes as its inputs an array 74 of floating-point numbers, comprising a 32-bit floating-point (FP) input tensor in the present example, along with a current value 76 of QF and the predefined value of OM 77. Floating-point conversion logic 73 is typically implemented as a part of quantization logic 36, but is shown here as a separate functional unit for the sake of conceptual clarity.

To convert the floating-point numbers to an intermediate array 75 of 32-bit fixed-point (integer) values, conversion logic 73 sets a shift value to be:

$$SV=\min\{(31-(OM+M+QF)),R\}$$

wherein R is the maximum shift value that can be applied for the given level of precision. For the 32-bit tensors of the present example, R=31. Conversion logic 73 converts the floating-point numbers to the fixed-point values in array 75 by applying a shift of SV bits to the mantissas. The radix point (corresponding to the location of line 52 in FIG. 2) is set to be SV. Quantization logic 36 then selects and writes the appropriate M bits to output tensor 40 in memory 42 based on QF, as described above.

Quantization controller 38 periodically verifies that current value 76 of QF is still the optimal value, and updates QF when necessary. For this purpose, for example, a counter 78 may count the number of input arrays 74 that have been processed by conversion logic 73 since the last QF update, and initiates the update routine when the count reaches a certain preset value, at an update decision step 79. (Alternatively, QF could be updated after every iteration of conversion logic 73, but because the update is computation-intensive, it can be advantageous to perform the update less frequently, as described here.) To update QF, quantization controller 38 finds max(input), i.e., the largest value in input array 74, and sets the new value of QF to be:

$$QF=(\text{Ceil}(\text{Log\_2}(\text{abs}(\max(\text{input}))))-SM)-M.$$

Example Implementation Including Rounding

When M bits are extracted from the N bits of the input number at an offset given by QF, the bits of the input number that are less significant than the extracted set of bits define a quantization remainder. Quantization logic 36 may simply truncate the quantization remainder, if the precision that is lost as a result is not significant. In most cases, however, it is desirable that the output number be rounded up or down depending upon the quantization remainder. Such rounding may be deterministic, simply incrementing the least significant bit of the extracted bits if the most significant bit of the remainder is '1'.

In some applications, on the other hand, such as training of neural networks, stochastic rounding has been found to give superior results in generating the output numbers. For this purpose, quantization logic 36 compares the quantization remainder to a random number, such as the output of a linear-feedback shift register (LFSR), as is known in the art. Assuming that the LFSR outputs a 16-bit random number, for example, quantization logic 36 compares this random value to the 16 most significant bits (MSB) of the quantization remainder. When QF<16, the quantization remainder will include less than 16 bits and is therefore padded with zeroes to length 16 before the comparison. Quantization logic 36 decides how to round the M extracted bits to give the corresponding output number based on this comparison. In other words if the value of the 16 MSB of the quantization remainder (with padding if necessary) is greater than or equal to the current random number, quantization logic 36 rounds the extracted value up by 1; whereas otherwise, the extracted value is not changed by rounding.

Formally stated, we define qLSB=QF+RDX (wherein RDX signifies the location of the radix point) to be the index in the input memory (accumulator 34) of the least significant bit of the M-bit extracted value. Based on the value of qLSB, quantization logic 36 extracts the following 16-bit comparison value:

$$compareValue_{16} = \begin{cases} \{acc_{32}[qLSB-1:0], 0s\}; & qLSB < 16 \\ acc_{32}[qLSB-1:QF-16]; & qLSB \geq 16 \end{cases}$$

Here "$acc_{32}$" refers to the 32-bit values held in accumulator 34, and "0s" represents the zeroes added for padding when qLSB<16. Given the current LFSR output ($LFSR_{16}$), quantization logic 36 then computes a stochastic rounding value (delta), which it adds to the set of extracted bits:

$$delta = compareValue_{16} \geq LFSR_{16}$$

Figure 5:
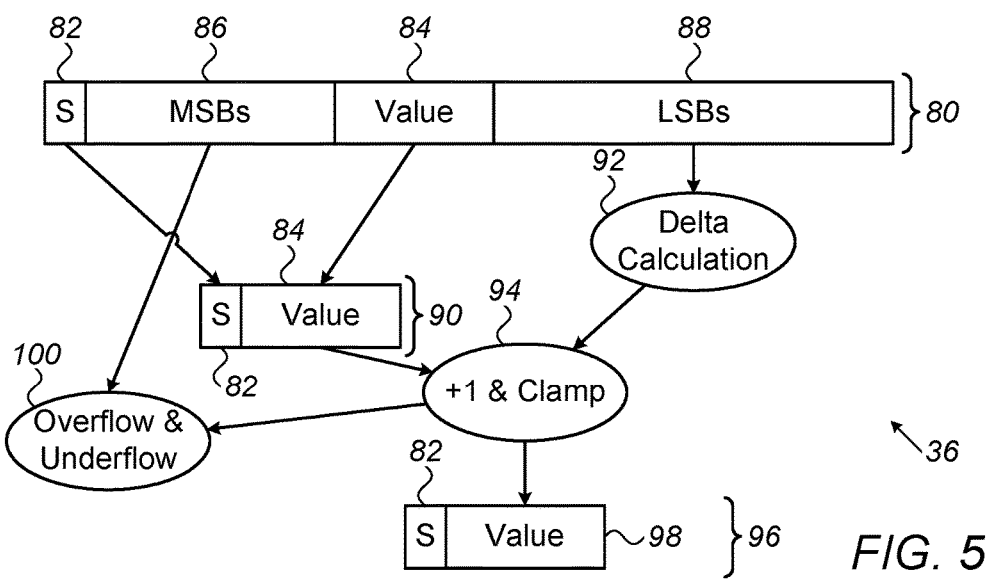
FIG. 5 is a block diagram that schematically shows details of quantization logic, in accordance with an embodiment of the invention.

FIG. 5 is a block diagram that schematically shows details of quantization logic 36, including the stochastic rounding function described above, in accordance with an embodiment of the invention. The input to quantization logic 36 is represented by an input number 80, which includes a sign bit 82, and an extracted value 84, comprising a set of M bits at an offset indicated by QF, as explained above. The bits of input number 80 that are more significant than the set of bits in extracted value 84, labeled most significant bits (MSBs) 86, define a possible overflow in quantization of the input number. A set of LSBs 88, which are less significant than extracted value 84, define the quantization remainder.

Sign bit 82 together with extracted value 84 together define an intermediate value 90. A delta calculation block 92 generates a random value and compares the random value to LSBs 88, with truncation or padding as needed depending on the value of QF, to generate the binary value of delta as defined above. A rounding block 94 then increments intermediate value 90 by the value of delta (either zero or one), to give an output value 98. If the rounding in block 94 will cause output value 98 to overflow the available M bits, however, rounding block 94 clamps value at the (maximal) level of value 90, and signals an overflow/underflow function 100 of quantization controller 38 to indicate that an overflow has occurred. Quantization logic 36 writes an output number 96, comprising sign bit 82 and output value 98, to output memory 42.

Overflow/underflow function 100 collects statistics on the numbers of overflows and underflows that occur in the course of operation of quantization logic 36 on a given array of input numbers, for use by quantization controller in updating QF for the next iteration, as explained above. Such overflows and underflows can be indicated both by rounding block 94, as explained above, and by non-zero MSBs 86. Based on these inputs, quantization controller counts overflows and underflows in corresponding registers, which are incremented on each overflow or underflow by the respective increment values:

$$OF_e = !S \&\& ((|MSBs) || Saturate)$$

$$UF_e = S \&\& (!(\&MSBs) || Saturate)$$

Here S represents sign bit 82 (which is zero for positive values and one for negative); &MSB indicates element-wise AND over all MSBs 86; and |MSB indicates element-wise OR over all MSBs 86. Saturate represents the overflow output of rounding block 94. When the overflow and/or underflow count exceeds a predefined limit (which can be set to zero), quantization controller 38 will increment QF, thus reducing the number of overflows, at the expense of reduced precision.

Although a particular hardware implementation has been described above for the sake of concreteness and clarity, the principles of the present invention may alternatively be implemented using other hardware components, as well as in software on a programmable processor. Such alternative implementations will be apparent to those skilled in the art after reading the present description and are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A computational device, comprising:
an input memory, configured to receive a first array of input numbers having a first precision, such that each input number is represented by N bits;
an output memory, configured to store a second array of output numbers having a second precision, less than the first precision, such that each output number is represented by M bits, M<N;
quantization logic, which is configured to read the input numbers from the input memory, to extract from each input number a set of M bits, at a bit offset within the input number that is indicated by a quantization factor, and to write a corresponding output number based on the extracted set of bits to the second array in the output memory; and
a quantization controller, which is configured to set the quantization factor so as to optimally fit an available range of the output numbers in the second array to an actual range of the input numbers in the first array in extraction of the M bits from the input numbers,
wherein the quantization controller is configured to adjust the quantization factor responsively to a predefined limitation on overflow in the extraction of the M bits from the input numbers and to fit the available range of the output numbers to the actual range of the input numbers in the first array by estimating a largest value among the input numbers, and setting the quantization factor so that the largest value fills but does not overflow the set of bits extracted by the quantization logic,
wherein the predefined limitation on the overflow is defined by a saturation margin SM, and wherein the quantization controller is configured to set the quantization factor to a value QF such that $2^{(M+QF)}$ is no less than the estimated largest value among the input numbers, and $2^{(M+QF-SM)}$ is less than the estimated largest value among the input numbers.

2. The device according to claim 1, wherein the input numbers comprise fixed-point numbers having a predefined radix point, and the quantization factor indicates a shift of the radix point in the output numbers relative to the input numbers.

3. The device according to claim 1, wherein the input numbers comprise floating-point numbers, while the output number comprise fixed-point numbers, and wherein the quantization logic is configured to convert the floating-point numbers to the fixed-point numbers, while setting a radix point of the fixed-point numbers responsively to the quantization factor.

4. The device according to claim 1, wherein the quantization logic is further configured to extract a sign bit from the input number and to apply the sign bit to the corresponding output number.

5. The device according to claim 1, wherein the bits of the input number that are less significant than the extracted set of bits define a quantization remainder, and wherein the quantization logic is configured to make a comparison between the quantization remainder and a random number, and to derive the corresponding output number by rounding the extracted set of bits responsively to the comparison.

6. The device according to claim 1, wherein the bits of the input number that are more significant than the extracted set of bits define an overflow, and wherein the quantization controller is configured to increment the quantization factor when the overflow exceeds a predefined limit.

7. A method for computation, comprising:
receiving in an input memory a first array of input numbers having a first precision, such that each input number is represented by N bits;
reading the input numbers from the input memory into quantization logic, and extracting from each input number, by the quantization logic, a set of M bits, M<N, at a bit offset within the input number that is indicated by a quantization factor;
writing, from the quantization logic to an output memory, a corresponding output number based on the extracted set of bits to a second array of output numbers having a second precision, less than the first precision, such that each output number is represented by M bits; and
setting the quantization factor, so as to optimally fit an available range of the output numbers in the second array to an actual range of the input numbers in the first array in extraction of the M bits from the input numbers,
wherein setting the quantization factor comprises adjusting the quantization factor responsively to a predefined limitation on overflow in the extraction of the M bits from the input numbers,
wherein adjusting the quantization factor comprises fitting the available range of the output numbers to the actual range of the input numbers in the first array by estimating a largest value among the input numbers, and selecting the quantization factor so that the largest value fills but does not overflow the set of bits extracted by the quantization logic, and
wherein the limitation on the overflow is defined by a saturation margin SM, and wherein setting the quantization factor comprises assigning a value QF to the quantization factor such that $2^{(M+QF)}$ is no less than the estimated largest value among the input numbers, and $2^{(M+QF-SM)}$ is less than the estimated largest value among the input numbers.

8. The method according to claim 7, wherein the input numbers comprise fixed-point numbers having a predefined radix point, and the quantization factor indicates a shift of the radix point in the output numbers relative to the input numbers.

9. The method according to claim 7, wherein the input numbers comprise floating-point numbers, while the output number comprise fixed-point numbers, and wherein extracting the M bits comprises converting the floating-point numbers to the fixed-point numbers, while setting a radix point of the fixed-point numbers responsively to the quantization factor.

10. The method according to claim 7, wherein writing the corresponding output number comprises extracting a sign bit from the input number and applying the sign bit to the corresponding output number.

11. The method according to claim 7, wherein the bits of the input number that are less significant than the extracted set of bits define a quantization remainder, and wherein writing the corresponding output number comprises making a comparison between the quantization remainder and a random number, and deriving the corresponding output number by rounding the extracted set of bits responsively to the comparison.

12. The method according to claim 7, wherein the bits of the input number that are more significant than the extracted set of bits define an overflow, and wherein setting the quantization factor comprises incrementing the quantization factor when the overflow exceeds a predefined limit.

* * * * *